United States Patent
Downey et al.

[11] Patent Number: 5,812,429
[45] Date of Patent: Sep. 22, 1998

[54] ADAPTIVE DIGITAL FILTER FOR AUTOMOTIVE APPLICATIONS

[75] Inventors: Joel Franklin Downey, Kokomo; Larry Andrew Kunk, Fishers, both of Ind.

[73] Assignee: Delco Electronics Corp., Kokomo, Ind.

[21] Appl. No.: 662,298

[22] Filed: Jun. 12, 1996

Related U.S. Application Data

[63] Continuation of Ser. No. 264,274, Jun. 23, 1994, abandoned.

[51] Int. Cl.$^6$ ..................................................... H03K 5/13
[52] U.S. Cl. ........................... 364/572; 364/574; 364/569; 324/166
[58] Field of Search ..................................... 364/572, 574, 364/569, 565, 724.01; 371/6; 324/160, 166, 167; 123/416, 417

[56] References Cited

U.S. PATENT DOCUMENTS

| | | | |
|---|---|---|---|
| 3,930,201 | 12/1975 | Ackermann et al. | 328/1 |
| 4,009,699 | 3/1977 | Hetzler et al. | 123/117 D |
| 4,175,507 | 11/1979 | Kawai et al. | 123/117 D |
| 4,233,592 | 11/1980 | Leichle et al. | 340/347 P |
| 4,265,211 | 5/1981 | Meloeny | 123/643 |
| 4,485,452 | 11/1984 | Cording et al. | 364/565 |
| 4,569,027 | 2/1986 | Nakano et al. | 324/160 |
| 4,639,885 | 1/1987 | Spock et al. | 364/572 |
| 4,707,791 | 11/1987 | Hmelovsky et al. | 364/569 |
| 4,716,535 | 12/1987 | Yoshida et al. | 324/166 |
| 4,843,580 | 6/1989 | Ridoux et al. | 364/572 |
| 4,902,970 | 2/1990 | Suquet | 324/166 |
| 4,962,470 | 10/1990 | Hansen | 364/572 |
| 4,992,730 | 2/1991 | Hagiya | 324/160 |
| 5,066,910 | 11/1991 | Sugiyama | 324/166 |
| 5,099,443 | 3/1992 | Higashimata et al. | 364/565 |
| 5,101,155 | 3/1992 | Oehler et al. | 324/166 |
| 5,150,317 | 9/1992 | Countryman | 364/724.01 |
| 5,446,375 | 8/1995 | Perkins | 364/565 |
| 5,448,483 | 9/1995 | Amsallen | 364/565 |
| 5,451,867 | 9/1995 | Loreck et al. | 324/166 |
| 5,459,398 | 10/1995 | Hansen et al. | 324/166 |
| 5,477,142 | 12/1995 | Good et al. | 324/166 |
| 5,477,472 | 12/1995 | Wise et al. | 364/574 |
| 5,487,595 | 1/1996 | Wise et al. | 324/166 |
| 5,541,859 | 7/1996 | Inoue et al. | 364/565 |

*Primary Examiner*—Emanuel T. Voeltz
*Assistant Examiner*—Eric W. Stamber
*Attorney, Agent, or Firm*—Mark A. Navarre

[57] ABSTRACT

An adaptive digital filter for filtering noise from a binary signal having a baseline that is low and including valid pulses that are high, a system for monitoring a rotating element employing such an adaptive digital filter, and a method for filtering. The adaptive filter discriminates noise pulses from valid pulses by eliminating pulses of shorter duration than a specified high time threshold and eliminating pulse occurring prior to the expiration of a specified low time threshold from the filtered signal generated by the filter from the binary signal. The filter also includes a mechanism for analyzing the filtered signal and dynamically and automatically adjusting the specified high time threshold and specified low time threshold based on timing changes in the filtered signal. A method of filtering is also presented whereby the specified high time and low time thresholds are adjusted dynamically in accordance with the timing data calculated by the filter. Also disclosed is a system for monitoring a rotating element having a discontinuity thereon as may be utilized in a timing or positioning system. In the system, the binary signal is generated by a discontinuity sensor for sensing the presence of at least one discontinuity. The valid pulses are thus representative of at least one discontinuity and the specified high and low time thresholds are adjusted by the filter of the system based on changes in rotational speed of the rotating element.

3 Claims, 9 Drawing Sheets

ADAPTIVE DIGITAL FILTER FOR AUTOMOTIVE APPLICATIONS

This is a continuation of application Ser. No. 08/264,274 filed on Jun. 23, 1994, now abandoned.

BACKGROUND OF THE INVENTION

1. Field of the Invention

The present invention relates to a digital filter, and, more particularly, to an adaptive digital filter for eliminating noise having a shorter duration than the pulses desired to be detected.

2. Description of the Related Art

There are several applications within the automotive environment in which a rotating element is utilized for timing or positioning purposes. For example, a crankshaft or camshaft may be utilized in conjunction with the vehicle's ignition system for the purposes of insuring proper timing operation of the engine and to ignite the cylinders every other revolution of the crankshaft. Another application is that of anti-lock braking systems (ABS) wherein the speed of the rotation of the disk is used to determine what load, i.e., the amount of resistance, should be applied to the wheel in which the disk is enclosed. In many instances, these rotating disks have teeth or slots on the outer rim of the disk. The teeth, or notches are discontinuities which are sensed by a magnetic sensor. The output waveform of the magnetic sensor is generally comprised of pulses occurring at times when a slot or tooth passes the sensor. It is these pulses which are utilized for timing and positioning purposes.

It is possible that unwanted pulses (noise events) of relatively short duration may be generated by the rotating disk itself. For example, imperfections, such as dings, scratches, or nicks, on the outer edge of the rotating disk may generate a noise event. Such imperfections may either be formed in the machining process or in the handling of the disk. Without another means of accommodating the noise events generated by such imperfections, the manufacturer is challenged with the task of implementing very high manufacturing tolerances as well as taking special precautions in the handling of the disk during assembly. Increased manufacturing tolerances and precautions in handling the disks are, however, expensive and therefore undesirable.

In addition to noise resulting from imperfections on the rotating disk, electrical noise may be generated by other sources such as those created by the environment in which the disk is utilized. Consider, for example, noise from the spark plug wires of an engine or the magnetic field generated by the ignition coil of an ignition system effecting pulses detected from a crankshaft associated with an ignition system. These electrical noise events must also be distinguished from the pulses created by the teeth or slots on the rotating disk.

Further, it is possible that an object in proximity to the disk may be loosely mounted, thereby resulting in unwanted vibrations of high frequency (short duration). Also, if employed in a moving vehicle, the movement of the vehicle over a rough surface may generate vibrations in the vehicle's structure that interfere with the desired pulses. Therefore, it is desired to develop an effective low-cost mechanism which distinguishes such noise events from the expected valid pulses generated by the teeth or slots on the rotating disk.

One method employed in distinguishing the noise events from the valid pulses is the implementation of a filter. In the situation in which a stream of pulses has a fixed rate and duty cycle, the implementation of a filter is quite simple. Because noise pulses are of a shorter duration than valid data pulses, when looking for a valid high pulse, high pulses detected below a specified minimum width are rejected. After a transition from a high pulse to a low pulse, the signal normally remains low for some predictable period. If the data line goes high sooner than this predictable period, noise is likely to be the cause. Therefore, low pulses below a specified minimum width are rejected by not permitting the filtered output to go high again until a valid low has been detected.

Consider the digital filter of U.S. Pat. No. 4,962,470, which is incorporated herein by reference, as representative of the prior art. This digital filter works in conjunction with a magnetic sensor to detect the position of a crankshaft or camshaft of an ignition system. The filter utilizes fixed, predetermined time periods for determining both valid high pulses and valid low pulses. Improvement over the prior art was made in the digital filter of U.S. Pat. No. 4,962,470 as it is synchronous, rather than asynchronous. By creating a synchronous filter, the filter is simpler to test. In particular, fault testing is easier to perform than with an asynchronous filter. In addition, the filter is less susceptible to variations in manufacturing of the integrated semi-conductor circuit than is an asynchronous filter. This results in increased reliability and productivity.

In addition to filtering the noise events caused by imperfections on the disk or sources present in the environment, the output of the magnetic sensor employed in these systems is also dependent upon the distance between the sensor and the rotating disk. Thus, in prior art systems, the manufacturer must generally take precautions to insure that the sensor is placed at a proper distance from the disk. It is desirable to provide a filter which compensates for variations in the distance between the sensor and the disk to provide greater flexibility in the assembly process of the system.

Another shortcoming of the filters of the prior art, including the digital filter of U.S. Pat. No. 4,962,470, is the inability of the filter to account for variations in the sensor waveform caused by changes in the rotational speed of the disk. At low RPMs, a relatively small signal is detected. At higher RPMs, a larger signal results having a narrower pulse width than at low RPMs. For example, the pulses generated by teeth or slots on a crankshaft in an ignition system may produce pulses of only 125 millivolts in amplitude at low RPMs and 150 Volt pulses at high RPMs. Though some systems employ an analog amplitude filter to accommodate such changes in pulse amplitude, no compensation is made for the changes in pulse width occurring with the change in RPM. In fact, at relatively high speeds, a slot or tooth on the disk may actually generate a signal that appears to be a noise event when compared to the predetermined time periods for the valid high and low pulses. Because the system does not accommodate pulse width changes, this problem often necessitates disablement of the filter at high RPMs. It is therefore desired to develop a digital filter for use with timing systems such as ignition systems and ABS systems which can compensate for variations in the signal resulting from a change in the rotational speed of the disk used in the system. Thus, the filter employed in such system must be an adaptive filter.

SUMMARY OF THE INVENTION

The present invention provides an adaptive digital filter for filtering noise from a binary signal having a baseline that is low and including valid pulses that are high. The adaptive digital filter is applicable in systems used for monitoring a rotating element having at least one discontinuity thereon as might be found in a timing or positioning system. In such a system, the valid pulses of the binary signal are generated by a discontinuity sensor and the frequency of the filtered pulse train analyzed by the filter is representative of the rotational speed of the rotating element. The present invention also provides a method for adaptively filtering noise from a binary signal.

The invention comprises, in one form thereof, a digital filter including a means for discriminating noise pulses from the valid pulses and for generating a filtered signal therefrom. The discriminating means eliminates noise pulses which are of shorter duration than a specified high time threshold or which occur prior to the expiration of a specified low time threshold from the binary signal. The filter also includes a means for analyzing the filtered signal and dynamically and automatically adjusting the specified high time threshold and specified low time threshold based on timing changes in the filtered signal.

In one embodiment thereof, the discriminating means includes a means for measuring the high and low times of the binary signal and a means for comparing the measured high and low times to the specified high and low time thresholds, respectively. In one form thereof, the comparing means comprises two comparators—one for comparison of high times and one for comparison of low times—and the measuring means comprises a counter connected to both comparators. The analyzing means may comprise a microprocessor having software executing thereon.

The invention also provides, in one form thereof, a system for monitoring a rotating element having at least one discontinuity thereon. The binary signal filtered is generated by a discontinuity sensor for sensing the presence of at least one discontinuity on the rotating element such that the valid pulses are representative of at least one discontinuity with each valid pulse, in the absence of noise, being high when the discontinuity is sensed. The system includes the filter of the present invention which analyzes the filtered signal to dynamically and automatically adjust the specified high time threshold and specified low time threshold based on changes in the filtered signal caused by a change in rotational speed of the rotating element.

In one embodiment thereof, the discontinuity sensor of the system comprises a magnetic sensor and a squaring circuit. The magnetic sensor includes an output and generates an analog signal transmitted to the sensor's output. The squaring circuit is connected to the output of the magnetic sensor and includes a means for converting the analog signal into a binary signal. The binary signal is of the type previously described herein.

In one embodiment thereof, the rotating element of the system of the present invention comprises a crankshaft in an engine. A wheel having discontinuities may be utilized for timing or positioning purposes as related to an ignition system used with that engine. The discontinuities may comprise notches or teeth on the radially outward edge of the crankshaft. In another embodiment, the rotating element comprises a disk in an anti-lock braking system.

The invention further comprises, in another form thereof, a method for filtering noise pulses from a binary signal wherein the binary signal has a baseline that is low and includes valid pulses which are high. In the first step, the binary signal is filtered by eliminating pulses of shorter duration than a specified high time threshold and pulses occurring prior to the expiration of a specified low time threshold. The filtered signal is then monitored and timing data representative of the frequency of the pulse train of the filtered signal is calculated. The specified high and low time thresholds are adjusted in accordance with the timing data. The method then returns to the step of filtering the binary signal.

In one embodiment thereof, the timing data comprises the pulse width of a valid pulse calculated by measuring the time during which the valid pulse is high. In another embodiment, the timing data comprises the time between two successive valid pulses calculated by measuring the time during which the signal remains low after detection of a valid pulse.

An advantage of the present invention is the ability to filter noise from a binary input signal whose valid pulses are predictably variable based on timing data acquired from the filtered signal in an efficient and cost effective manner. When viewed in terms of the particular application of the filter in a timing or positioning system, the advantages of the use of the filter of the present invention are numerous. First, the filter effectively eliminates noise generated by imperfections in the rotating element, thereby providing the manufacturer with greater flexibility in the manufacturing process. Specifically, lower tolerances may be employed in making the radially outward surface of the rotating element having the discontinuity(ies) thereon, and fewer precautions are necessary in handling the finished rotating element, thereby reducing manufacturing costs.

Another advantage of the implementation of the digital filter of the present invention in the timing or positioning system is the ability to effectively filter noises generated in the system's environment such as electrical or vibrational noise emanating from various sources. Still another advantage is the ability to use the filter throughout the entire RPM range of operation of the rotating element. Because prior art filters utilized fixed, predetermined thresholds, valid pulses appeared to be noise at high disk rotational speeds. This problem is addressed and resolved with the adaptive digital filter of the present invention due to the filter's ability to adjust the threshold values used for filtering purposes as the speed of rotation of the disk changes.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein.

Corresponding reference characters indicate corresponding parts throughout the several views. The exemplification set out herein illustrates a preferred embodiment of the invention, in one form, and such exemplification is not to be construed as limiting the scope of the invention in any manner.

DETAILED DESCRIPTION OF THE INVENTION

Figure 1:
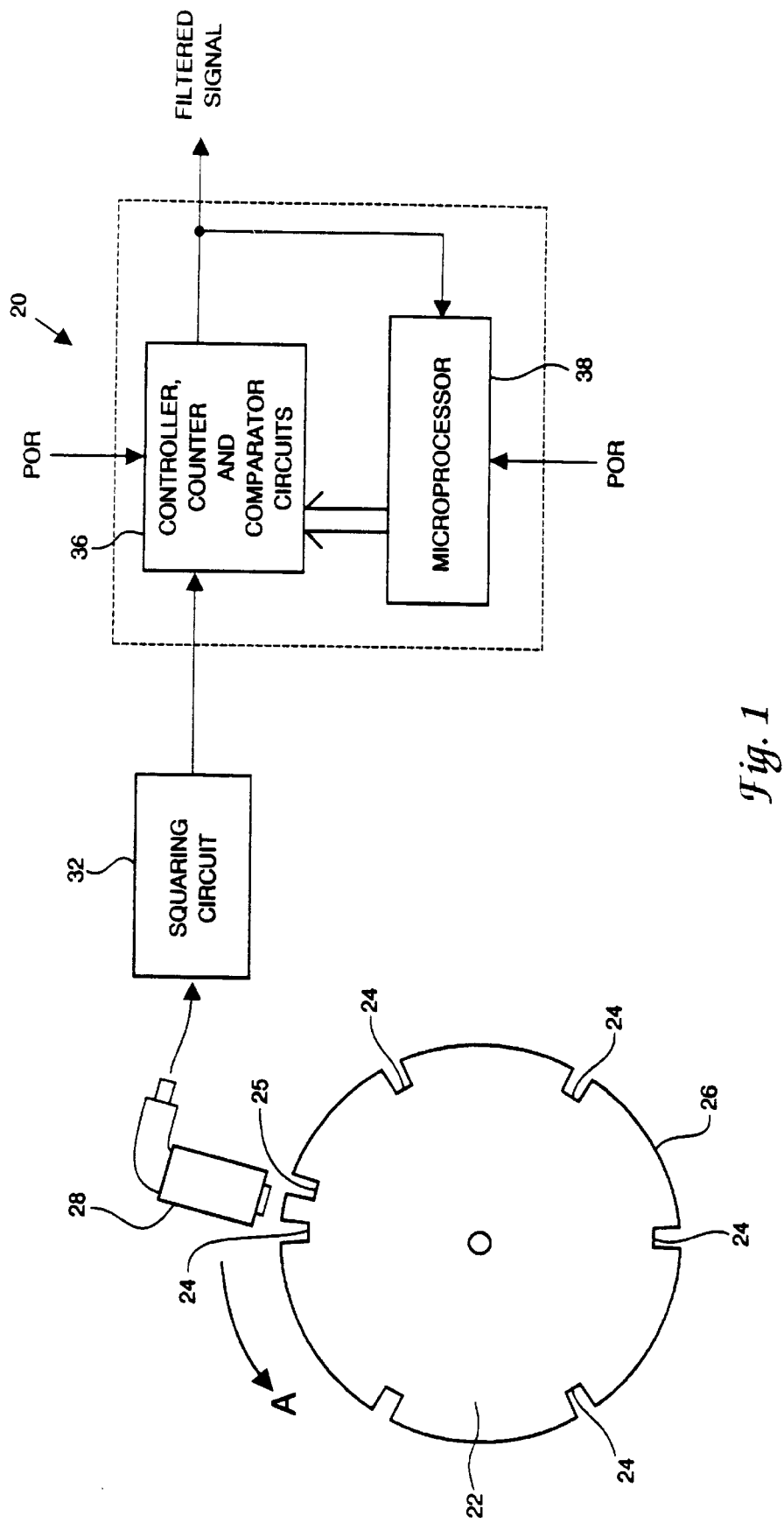
FIG. 1 is a block diagram of one embodiment of the adaptive digital filter of the present invention as applied to an automotive crankshaft.

Referring now to the drawings and particularly to FIG. 1, there is shown a block diagram of one embodiment of the adaptive digital filter of the present invention as applied to an automotive crankshaft. In this embodiment, adaptive digital filter 20 is utilized in conjunction with an ignition system as might be found in an automobile. The ignition system includes rotatable disk 22 on a crankshaft having slots 24, 25 therein. Rotatable disk 22 is rotatable in direction A as shown and slots 24, 25 reside on the radially outward portion 26 of disk 22. Even slots 24 are evenly spaced about the radial edge 26 of the disk while odd slot 25 is disposed next to one of the even slots 24 on radial edge 26. While even slots 24 are used for the purpose of timing, odd slot 25 is used to determine a specific position on disk 22. For example, in an ignition system it is desired to utilize a specific position on disk 22 to correspond to ignition of the first cylinder in the vehicle's engine. For applications, such as anti-lock braking systems wherein the rotational speed of the rotating element is all that is necessary to ascertain, odd slot 25 may not be present on disk 22.

To detect the presence of slots 24, 25 on disk 22, sensor 28 is positioned radially outward from radial edge 26 of disk 22. In this embodiment, sensor 28 comprises a variable reluctance magnetic sensor, such as part no. DR6043 available from Delco Remy, which measures the voltage induced as radial edge 26 passes the sensor. Specifically, differences in voltage caused by the differences in distance between sensor 28 and radial edge 26 occurring at slots 24, 25 are detected by sensor 28 to result in the generation of a signal, such as sensor waveform 30 shown in FIG. 2.

Connected to sensor 28 is a typical squaring circuit 32. Squaring circuit 32 receives sensor waveform 30 as input and converts waveform 30 to squared pickup waveform 34, such as that shown in FIG. 2. By utilizing squaring circuit 32, waveform 30 is thereby converted to a signal, namely squared pickup signal 34, that may be digitally analyzed by filter 20 of the present invention or by other digital circuitry.

The output of squaring circuit 32 is connected to digital filter 20 of the present invention so that squared pickup signal 34 is "filtered" to provide a filtered signal as is explained in greater detail herein. To accomplish this filtering, digital filter 20 is comprised of controller, counter and magnitude comparator circuitry 36 which receives squared pickup signal 34 and outputs the filtered signal. Also included in digital filter 20 is microprocessor 38. Microprocessor 38 is in communication with controller, counter and magnitude comparator circuitry 36, as further described herein, and is responsible for the adaptive nature of the filter as is described herein. Power on reset, POR, is provided as input to both controller circuit 36 and microprocessor 38.

Figure 2:
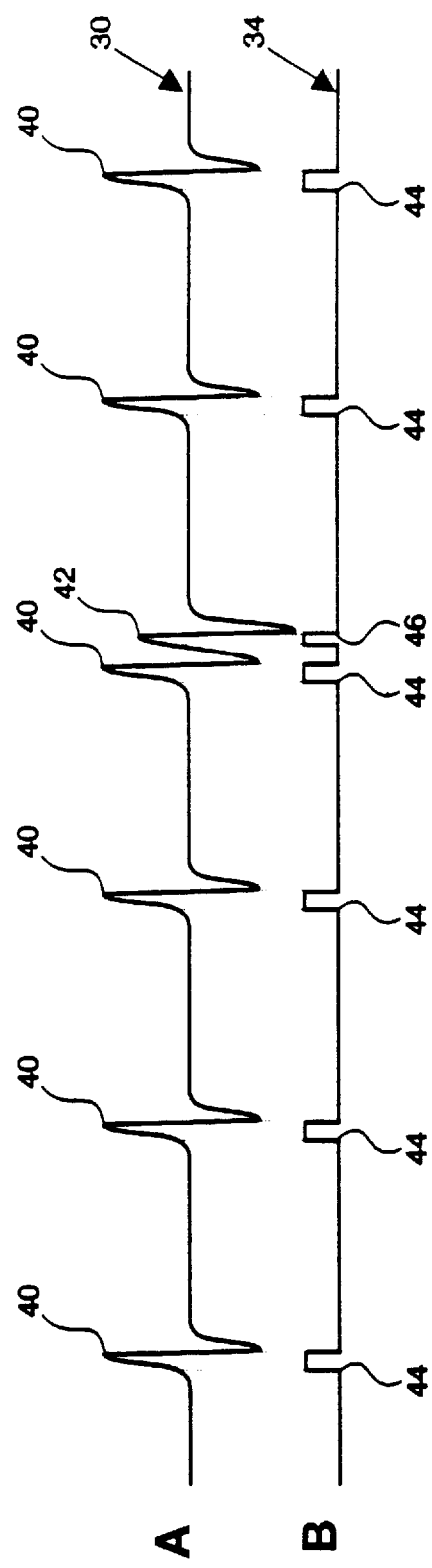
FIG. 2 is a graph of a sensor waveform as collected by the sensor of FIG. 1 compared to the squared pickup waveform generated by the squaring circuit of FIG. 1 in response to the sensor waveform.

FIG. 2 shows a graph of a sensor waveform as collected by the sensor of FIG. 1 compared to the squared pickup waveform generated by the squaring circuit of FIG. 1 in response to the sensor waveform. Sensor waveform 30 is comprised of several valid pulses, each pulse corresponding to one of slots 24, 25 on disk 22 as shown in FIG. 1. Specifically, timing pulses 40 are generated by even slots 24 and positioning pulse 42 is generated by odd slot 25. When sensor waveform 30 is passed through squaring circuit 32, squared pickup waveform 34 (denoted as *SPU—the asterisk implies that the signal is asynchronous, i.e., it is not synchronized with the clock of filter 20) results. *SPU 34 includes squared timing pulses 44 and squared position pulse 46 corresponding to timing pulses 40 and positioning pulse 42, respectively. Note that positioning pulse 42 is of lower amplitude than timing pulses 40 and that squared positioning pulse 46 is narrower (has a smaller pulse width) than squared timing pulses 44. Because odd slot 25 is disposed in proximity to one of even slots 24, the decrease in amplitude and in pulse width are caused by lag of sensor 28.

It will be appreciated by those of skill in the art that the sensor waveform illustrated in FIG. 2 is representative of outputs to be analyzed in applications other than the specific ignition system application illustrated in FIG. 1. For example, rotating element may have teeth rather than slots on the rotating element. Thus, all discontinuities (teeth, slots, notches, etc.) on a rotating element which are used for timing or positioning purposes are contemplated as being within the scope of the invention when such discontinuities generate a signal having valid pulse and wherein the signal may be corrupted by noise events and therefore require the implementation of a filter. As to other applications, a rotatable disk having discontinuities thereon is also utilized in anti-lock braking systems to generate a signal akin to that of the sensor waveform shown in FIG. 2 for the purpose of determining the rotational speed (a timing function) of the disk. The actual position of the disk in anti-lock braking systems is not ascertained for control of the brakes and therefore the disk is likely to be comprised of only evenly spaced protrusions. These and other applications are contemplated to be applications for which the adaptive digital filter of the present invention may be employed.

The expected widths of valid pulses and the time between successive valid pulses in sensor waveform 30 vary according to the rotational speed of disk 22. As the rotational speed of disk 22 increases, the pulse widths and the time between successive valid pulses decrease. Filter 20, as described in further detail herein, adjusts filtering parameters (specified thresholds) according to the measured rotational speed of disk 22.

In this embodiment, squared pickup waveform 34 comprises a binary signal having a baseline that is low and including valid pulses 44, 46 which are high. The filtering parameters adjusted by filter 20 are a specified high time threshold and a specified low time threshold. The high time threshold relates to a period of time during which the signal is to remain high to be indicative of a valid pulse. The low time threshold relates to a period of time between successive valid pulses in which the signal is to remain low. It will be appreciated that the binary signal, squared pickup waveform 34, may be inverted, i.e., the binary signal may have a baseline that is positive and include valid pulses which are negative. Such an inverted binary signal is contemplated to be within the scope of the invention. Thus, the terms "high" and "low" as used herein and in the claims are not to be construed as having an absolute meaning, but rather are indicative of the two states of the signal—one state indicative of the baseline and the other state indicative of valid pulses.

Figure 3:
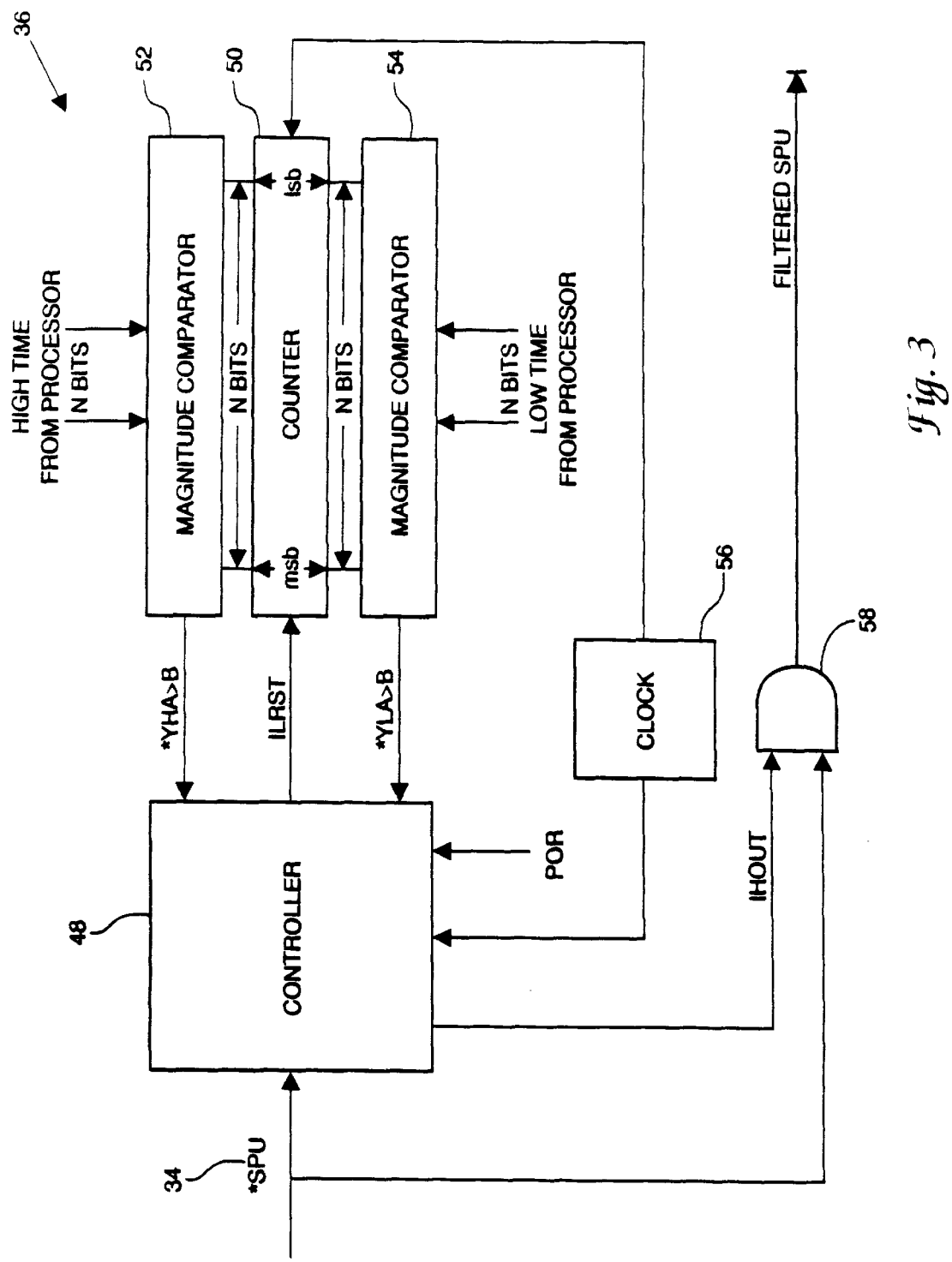
FIG. 3 is a block diagram of one embodiment of the controller, counter and magnitude comparator circuits of the adaptive digital filter of the present invention.

Referring now to FIG. 3, there is shown a block diagram of one embodiment of the controller, counter and magnitude comparator circuits of the adaptive digital filter of the present invention. Circuit 36 comprises controller 48, counter 50, and first and second magnitude comparators 52 and 54, respectively. Circuit 36 also includes clock 56 and AND gate 58. Note that in this embodiment, a single counter, counter 50, is used in conjunction with two comparators—one, first magnitude comparator 52, used for high time processing and another, second magnitude comparator 54, used for low time processing. Though two counters may be utilized, use of a single counter is preferable to reduce the manufacturing costs of controller circuit 36.

Figure 4:
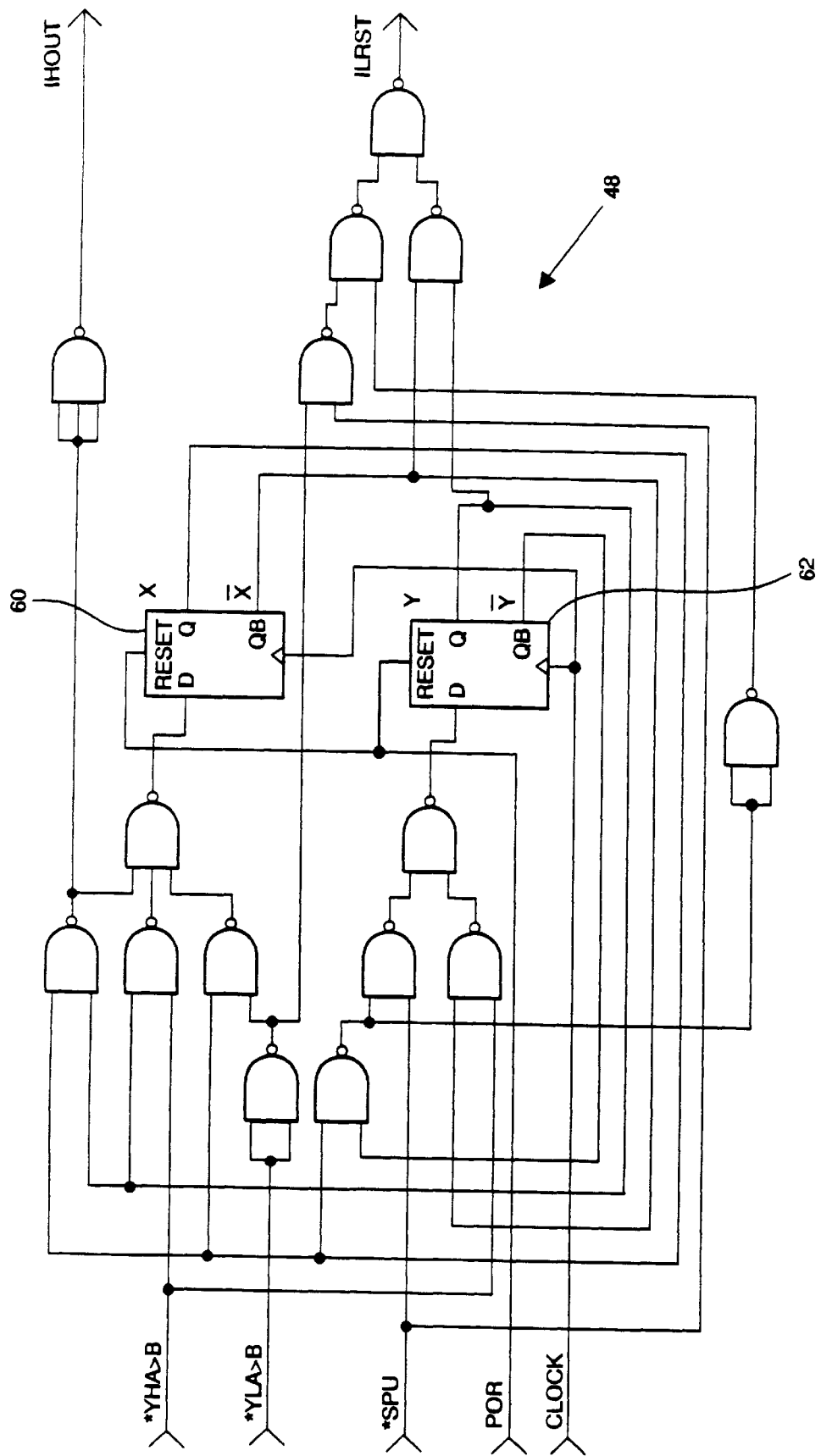
FIG. 4 is a schematic diagram of the controller section of the circuit of FIG. 3.

Controller 48 is shown in greater detail in FIG. 4. In general, the inputs to controller 48 include squared pickup waveform 34 (*SPU) which is an asynchronous signal at this point—asynchronous in that squared pickup waveform 34 is not synchronized with clock 56 of controller circuit 48. Also, input to controller 48 is power on reset signal POR. POR ensures that controller 48 is in a known state when electrically activated to begin the algorithm of controller 48 at the proper point in time, one that is synchronized with clock 56. As shown, a signal from clock 56 is also provided as input to controller 48.

Figure 5:
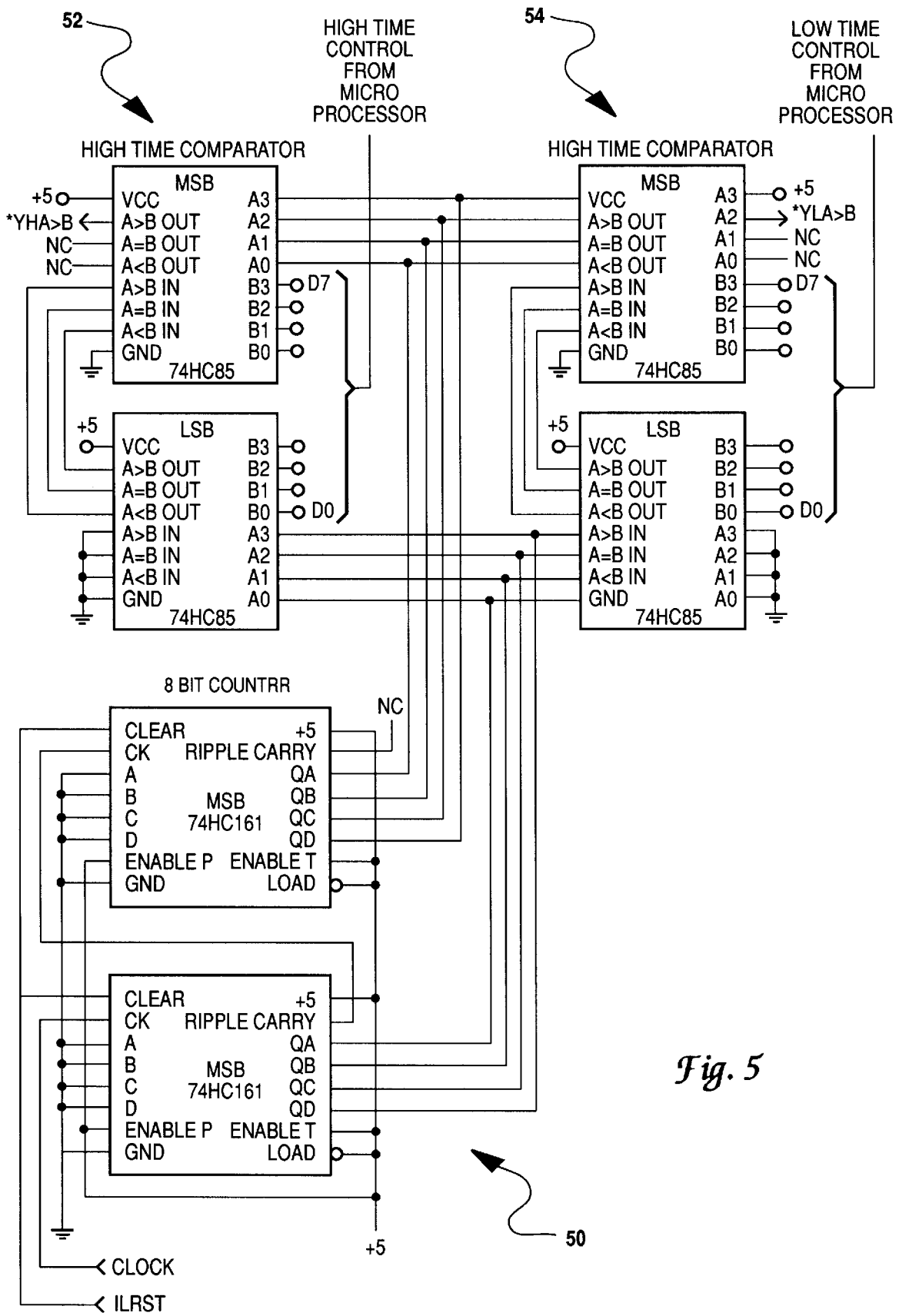
FIG. 5 is a schematic diagram of the magnitude comparators and the counter of the circuit of FIG. 3.

Controller 48 is connected to first and second magnitude comparators 52 and 54 as shown in this figure and in FIG. 5. First and second magnitude comparators 52 and 54 provide state information (*YHA>B and *YLH>B) which are described in further detail herein.

There are two outputs from controller 48. ILRST (immediate output, active low reset) is sent to counter 50 upon receipt of POR by controller 48 to reset counter 50. More specifically, ILRST occurs whenever controller 48 is in State A, designated by STATE CODE 00, as is described in further detail herein. POR forces controller 48 into State A. IHOUT (immediate output, active high output) is sent to AND gate 58 whenever controller 48 is in State C, designated by STATE CODE 11, as discussed herein. In general, IHOUT is ANDed with asynchronous squared pickup waveform (*SPU) 34 by AND gate 58 to result in the filtered square pickup signal.

FIG. 4 is a detailed schematic of controller 48 of the embodiment of circuit 48 shown in FIG. 3. The logic of controller 48, comprising a simple digital circuit including first and second flip-flops 60 and 62, respectively, is explained in greater detail in association with FIG. 7 herein. The detailed interconnection of first and second magnitude comparators 52 and 54 to counter 50, to microprocessor 38 and to controller 48 are shown in FIG. 5. In this embodiment, both first and second comparators 52 and 54 are each comprised of two four-bit magnitude comparators, such as part no. 74HC85 available from Motorola, Inc. Counter 50 is comprised of two presetable four-bit binary counters, such as part no. 74HC161 available from Motorola, Inc.

Figure 6:
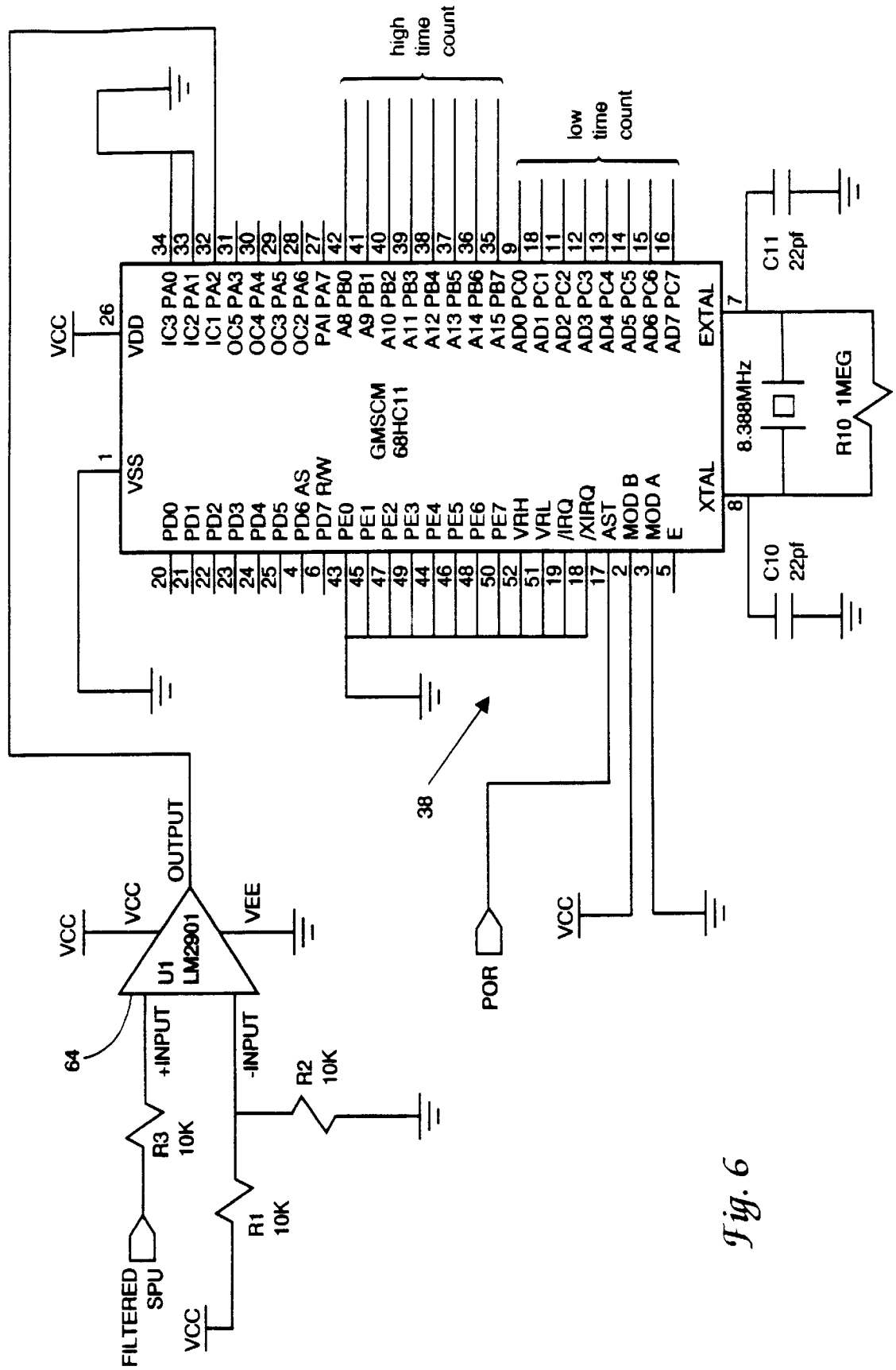
FIG. 6 is a schematic diagram of the microprocessor of the controller circuit of FIG. 3.

Microprocessor 38, in this embodiment comprising part no. 68HC11 available from Motorola, Inc., is shown in greater detail in FIG. 6. Microprocessor 38 is connected to first and second comparators 52 and 54 as shown, providing an eight (8) bit high time count and an eight (8) bit low time count to the respective comparators. Input to microprocessor 38 is the filtered square pickup signal which is transmitted through analog comparator 64, in this embodiment, part no. LM2901 available from Motorola, Inc., prior to connection to pin 32 (IC1 PA2) of microprocessor 38.

Figure 7:
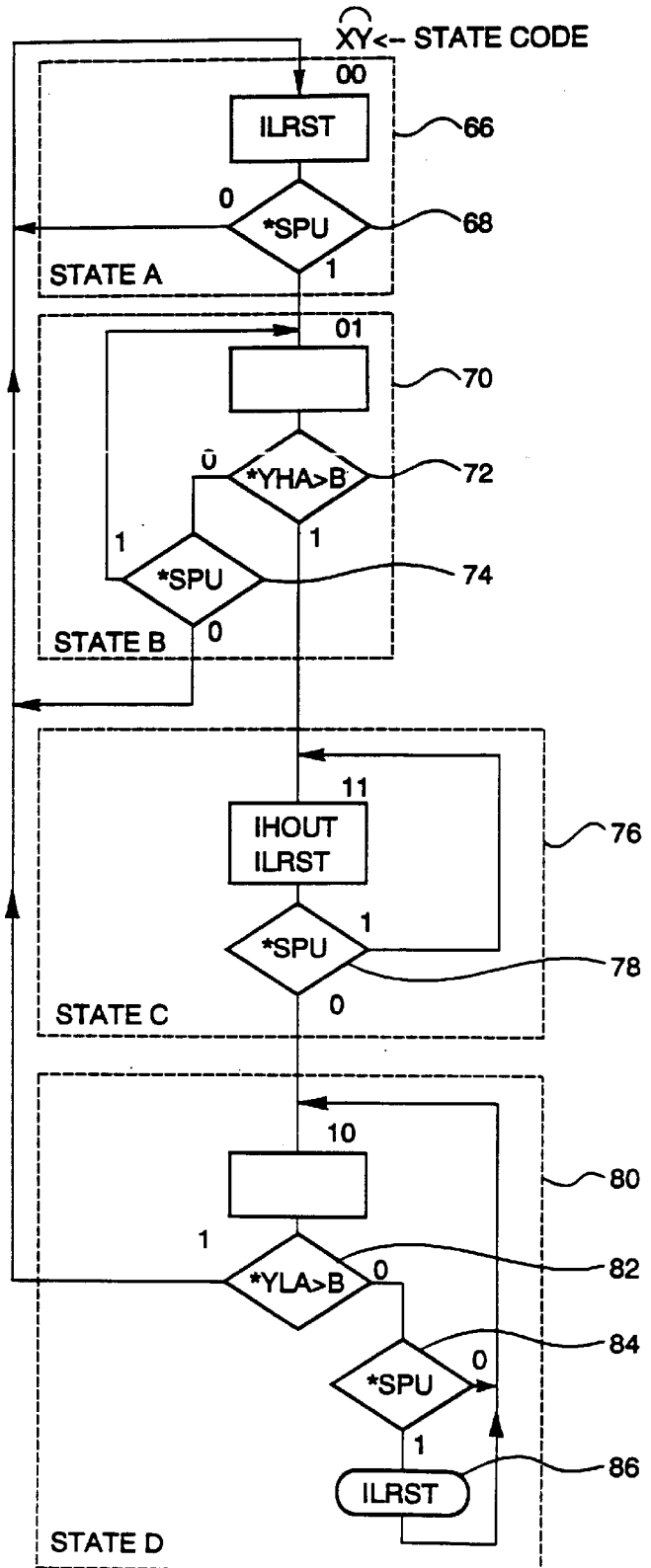
FIG. 7 is an algorithmic state machine chart for one embodiment of the controller section of the circuit of the adaptive digital filter of the present invention.

Referring now to FIG. 7, there is shown an algorithmic state machine chart for the embodiment of the controller shown in FIG. 4. The valid high time and valid low times referred to in the discussion below refer to a specified high time threshold and a specified low time threshold respectively, for the next expected pulse to be detected by controller 48 in conjunction with counter 50 and magnitude comparators 52 and 54. The STATE CODE, identified on FIG. 7 as XY, corresponds to the states of first and second positive-edge triggered flip-flops 60 and 62, respectively. When the STATE CODE is "00", i.e., when the states of both flip-flops 60 and 62 are "0", controller 48 is in State A and is looking for a valid high on *SPU 34. Controller 48 asserts ILRST in State A 66 and monitors squared pickup waveform (*SPU) in State A as designated by decision symbol 68. When *SPU goes high, i.e., is "1", controller 48 advances to State B 70, wherein the STATE CODE is "01", on the rising edge of clock 56. Otherwise, if *SPU is low, i.e., is "0", controller 48 remains in State A. All transitions to and from States A, B, C and D occur on rising edges of clock 56. The state entered is determined by the logic signal presented to input D on flip-flops 60 and 62 at the time a rising clock edge occurs.

In State B 70, controller 48 is looking for a valid high time as a high signal was detected in State A. To accomplish this task, controller 48 monitors the signal *YHA>B provided by first magnitude comparator 52 (see FIGS. 3 and 5) shown by decision symbol 72. If *YHA>B is high, indicating that a valid high signal was present for a sufficient amount of time, controller 48 advances to State C 76. When in State B, if *YHA>B is low, *SPU is again monitored as designated by decision symbol 74. If, in State B, *YHA>B is low and *SPU is high, controller 48 remains in State B. If *YHA>B is low and *SPU returns low, controller 48 returns to State A on the rising edge of clock 56.

During State C 76, controller 48 has detected a valid high signal and is now looking for a low signal. Therefore, IHOUT is output to AND gate 58 to be combined with *SPU. During State C 76, ILRST is output to counter 50 to reset counter 50. In State C, controller 48 monitors *SPU as designated by symbol 78. If *SPU remains high, indicating that the signal is still high, controller 48 remains in State C. If *SPU goes low, controller 48 advances to State D 80 on the rising edge of clock 56.

During State D 80, controller 48 is watching for a valid low time as designated by decision symbol 82. Therefore, IHOUT is unasserted so that the output of AND gate 58 falls to logic zero. The signal *YLA>B from second magnitude comparator 54 is monitored. If *YLA>B is high, a valid low time has been found by controller 48 and controller 48 returns to State A 66. If, on the other hand, *YLA>B is low, controller 48 monitors *SPU as designated by decision symbol 84. If *SPU remains low, controller 48 remains in State D. If *SPU goes high before a valid low time, controller 48 immediately resets the counter as indicated by conditional output symbol by asserting an ILRST signal to counter 50. In this manner, counter 50 is reset should *SPU remain low for a shorter duration than required.

Figure 8:
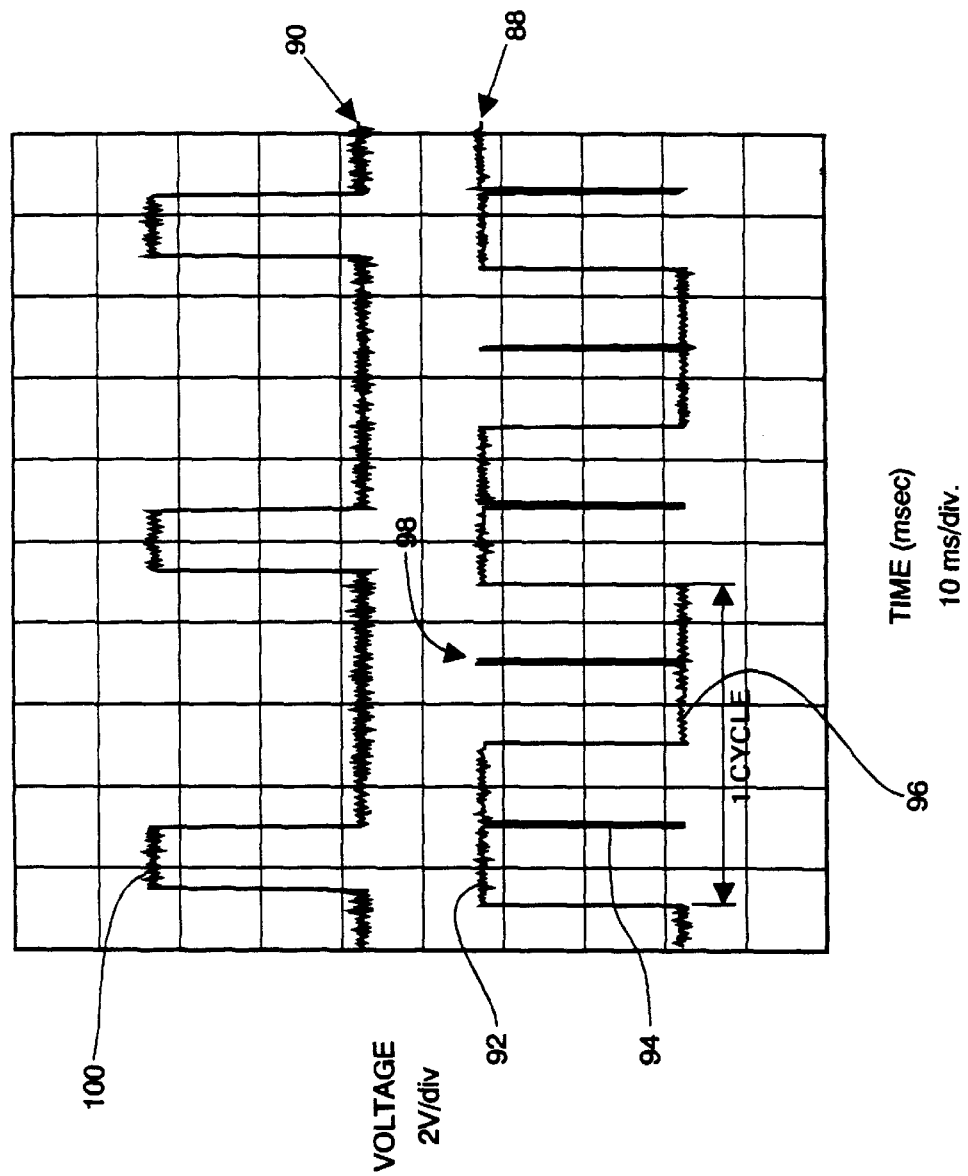
FIG. 8 is an exemplary graph of an unfiltered squared pickup waveform compared to a squared pickup waveform that has been filtered by the adaptive digital filter of the present invention.

Referring now to FIG. 8, there is shown an exemplary graph of an unfiltered squared pickup waveform compared to a squared pickup waveform that has been filtered by the adaptive digital filter of the present invention. The unfiltered squared pickup signal *SPU is represented by unfiltered curve 88 while filtered curve 90 represents the filtered squared pickup signal resulting from the application of the adaptive digital filter according to the present invention. Unfiltered curve 88 is comprised of long-duration high pulse 92, short-duration low pulse 94, long-duration low pulse 96 and short-duration high pulse 98. These pulses are repeated at about 25 times per second. In this embodiment, short-duration low and high pulses 94 and 98, respectively, represent unwanted noise events to be filtered from the output signal. Filtered curve 90 does not contain noise pulses 94 and 98 but rather contains filtered pulse 100 which rises at a time after long-duration high pulse 92 rises and lowers at the point in time at which short-duration low pulse 94 lowers. The delay between when long-duration high pulse 92 rises and filtered pulse 100 rises is determined by high time filter parameters.

In general, the application of the adaptive digital filter of the present invention to unfiltered curve 88 passes long-duration high pulse 92 as output as the duration between its rise and the occurrence of short-duration low pulse 94 is long enough to be considered a valid pulse rather than noise. While at a low, the rise of short-duration low pulse 94 is rejected as indicative of the start of a valid pulse as the signal's low does not occur for a sufficient amount of time to be considered a valid low. Short-duration high pulse 98 is also rejected as it does not remain high for a sufficient amount of time.

Examining unfiltered curve 88 in terms of the state algorithmic chart presented in FIG. 7, at the beginning of unfiltered curve 88, controller 48 is in State A, asserting ILRST and monitoring unfiltered curve 88 presented to controller 48 by *SPU. When unfiltered curve 88 goes high at the point at which long-duration high pulse 92 rises, controller 48 advances to State B. Before short-duration low pulse 94 falls, *YHA>B is high, indicating that unfiltered curve 88 remained high long enough to be a valid high pulse, and controller 48 advances from State B to State C. In State C, IHOUT is asserted to AND gate 58 and ILRST to counter 50. When unfiltered curve 88 falls, *SPU goes low and controller 48 advances to State D. *YLA>B remains low as unfiltered curve 88 has not remained low long enough to indicate the presence of a valid low pulse. Therefore, controller 48 remains in State D. When *SPU rises at the rising edge of short-duration low pulse 94, controller 48 asserts ILRST and remains in State D. The counter, via assertion of ILRST, will continually be reset until the beginning of long-duration low pulse 96. When *YLA>B goes high, a valid duration low pulse has been detected and controller 48 enters State A.

In this embodiment, prior to the occurrence of short-duration high pulse 98, *YLA>B is high and controller 48 is in State A. When the rising edge of short-duration high pulse 98 occurs, controller 48 enters State B. Unfiltered curve 88 is high for a short time during short-duration high pulse 98 and the high time of short-duration high pulse 98 is shorter than that of a valid pulse. Therefore, controller 48 remains in State B until unfiltered curve 88 goes low at the time corresponding to the fall of short-duration low pulse 98. At this point, controller 48 returns to State A. Thus, both short-duration low pulse 94 and short-duration high pulse 98 are filtered by controller 48 as noise.

It will be appreciated by those of skill in the art that the logic of controller 48 may be accomplished by other means than the digital circuitry presented herein. For example, controller 48 may be replaced with a microprocessor having software executing thereon so long as the microprocessor has sufficient throughput. It is conceivable that microprocessor 38 of the embodiment of FIG. 1 may be utilized for the controller functionality, providing microprocessor 38 is not overburdened with other responsibilities. In an application where microprocessor 38 is responsible for other functions related to the ignition system, such as controlling spark and fuel and monitoring coolant temperature or handling requests for invoking the air conditioner, it may be preferable to utilize a hardware controller. Nevertheless, other mechanisms employed to result in the functionality of controller 38 are contemplated to be within the scope of the invention.

At this point in the description of the adaptive digital filter of the present invention, the adaptability of the filter has not been discussed. The state algorithmic chart of FIG. 7 representing controller 48 may appear to be functionally equivalent to that of U.S. Pat. No. 4,962,470 as the filter eliminates pulses of shorter duration than a specified high time threshold and pulses occurring to the expiration of a specified low time threshold from an incoming binary signal. This is true only if the valid high times and valid low times (specified high time threshold) represented by the signals provided to controller 48 by first magnitude comparator 52 via *YHA>B and by second magnitude comparator 54 via *YLA>B, respectively, are constant, selectable from among two or more predetermined values. However, as is discussed in greater detail herein, the valid high and low times provided to controller 48 of the present invention are continuously variable. In general, microprocessor 38 monitors the filtered signal to adapt the valid high and low times according to the signal it receives. Specifically, the points at which *YHA>B, indicating a valid high time, and *YLA>B, indicating a valid low time, are set as high are determined by microprocessor 38 of the filter and communicated to the magnitude comparator of circuit 36.

Before examining the specific embodiment of the software algorithm disclosed herein, consider first the general problem of filtering variable rate pulses, given a constant duty cycle. As the pulse rate is increased, the duration of the high pulse decreases. Similarly, the duration of the low portion of the signal which immediately proceeds a high decreases as the pulse rate increases. A filter which is not adaptive, i.e., a filter which uses constant, predetermined valid high and low times, will reject high pulses occurring at high pulse rates because they are narrower than the minimum width, and/or the filter will reject a valid high, because the low period proceeding the high is not of sufficient length. Thus, when a non-adaptive filter is utilized, the filter must be bypassed when the pulse rate exceeds a certain rate.

Consider, for example, the pulse generated by the odd slot in the embodiment of FIG. 1. As previously stated, the pulse width of the pulses detected by sensor 32 which are representative of slots 24 decrease with an increase of the rotational speed of disk 22. The amplitude of pulses represented of slots 24 increase with an increase in rotational speed of disk 22. Also, the proximity of odd slot 24 to an even slot 25 results in the odd slot pulse being of lower amplitude and narrower width than even slots 24 due to sensor lag. Depending on the values of the constant, predetermined valid high and low times, it is apparent that the pulse generated by odd slot 25 will be filtered from the output—it will be detected as noise—at high pulse rates.

To avoid filtering a valid pulse as noise, the filter must be cognizant of both the pulse rate and the duty cycle of expected valid signals. For rotational, mechanical systems, such as the crankshaft or camshaft utilized in an ignition system or a rotatable disk utilized in an ABS system, the pulse rate changes at a maximum rate of change as determined by Newton's law. For example, a crankshaft employed in an ignition system is acted upon through its shaft by a force generated by the expanding gasses in the engine's cylinders). Because the force of the expanding gasses is limited, rotational acceleration of the rotating crankshaft is thereby limited. Also, rotational deceleration of the rotating crankshaft is limited due to the requirement of the application of a force thereto. These limitations in acceleration and deceleration provide guidance as to limits in changes in the pulse rate and pulse width per revolution. Thus, pulse widths are predictably variable provided an allowance for acceleration is made. By measuring the pulse width at regular intervals, the optimal parameters for a filter can be applied in real time.

Application of an adaptive digital filter is most straightforward when the valid pulses are evenly spaced from each other. This includes an application such as in ABS systems wherein the slots or teeth (protrusions) on the rotating disk are all evenly spaced from each other. For evenly spaced valid pulses, only one set of parameters may need to be determined in real time. In an application such as the embodiment of FIG. 1 wherein all valid pulses are not evenly spaced from each other, a set of parameters for each expected valid pulse (the pulse created by each slot or tooth) may be necessary. Use of a single set of parameters may inadvertently filter the valid pulse generated by the odd slot. A set of parameters for each valid pulse may also be desired in an application wherein one of the discontinuities is sized differently from another such that the high time of the pulses differ.

Figure 9:
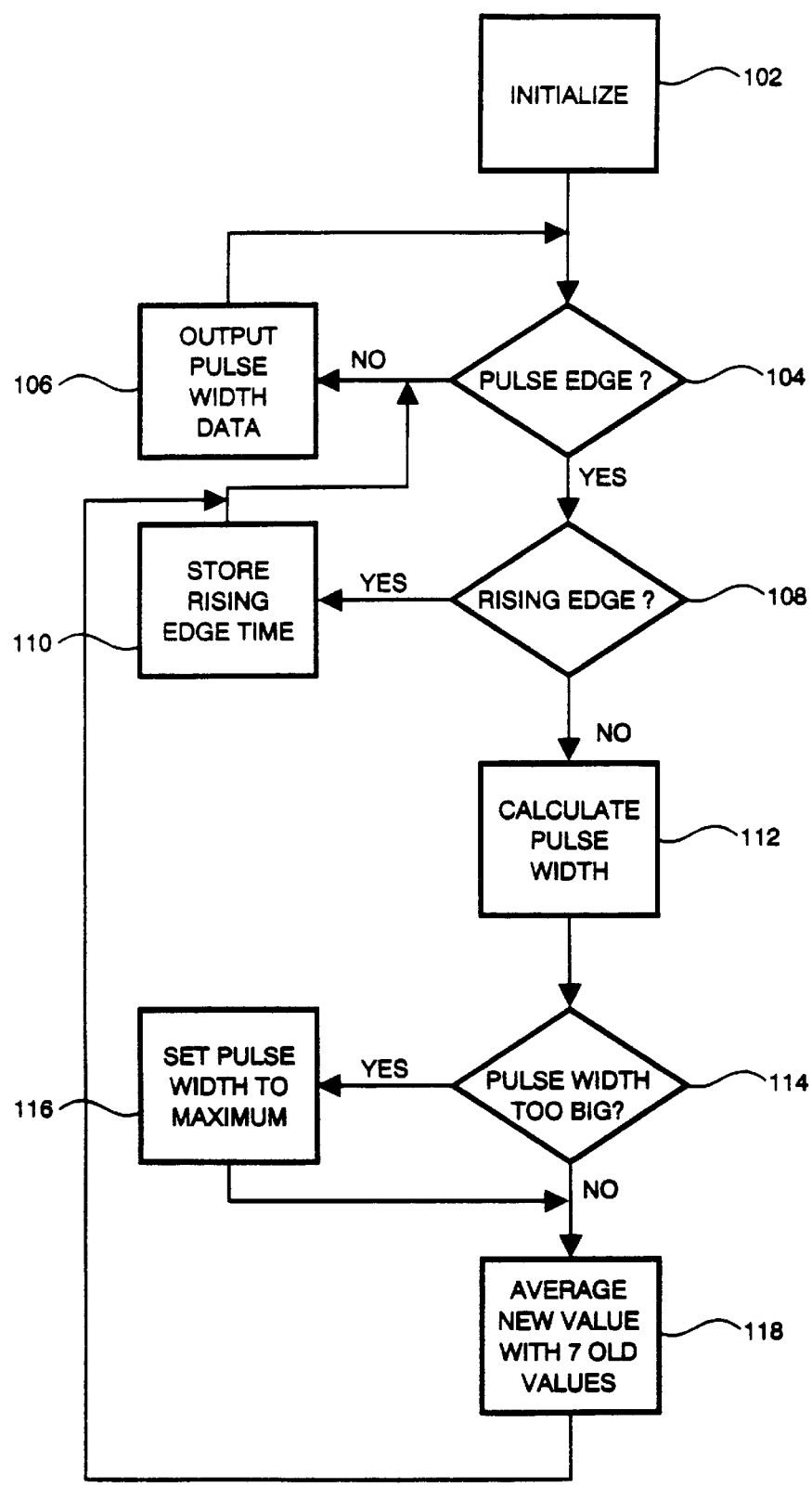
FIG. 9 is a flow chart of one embodiment of the software executing in the microprocessor of the digital filter of the present invention.

FIG. 9 shows a flow chart of one embodiment of the software executing in the microprocessor of the digital filter of the present invention. During step 102, the counter frequency is initialized to approximately 131 Khz, port C of the microprocessor is established as an output, default filter times are loaded, the software is setup to capture the rising edge of a first detected pulse, and the interrupt for edge captures is enabled. Upon startup of the microprocessor, the processor's COP is serviced and filter data is stored to ports B and C of the processor. Serving as input to microprocessor 38 is the filtered signal, as illustrated in FIG. 1.

In step 104, the software looks at the filtered signal for a pulse edge. If a pulse edge is not detected, pulse width data is output in step 106 and the microprocessor continues to look for a pulse edge. If in step 104 a pulse edge is detected, the microprocessor ascertains whether or not the pulse edge is a rising pulse in step 108. If the pulse edge is a rising pulse, the rising edge time is stored in step 110, pulse width data is output in step 106 and the microprocessor continues to look for another pulse edge. If the edge detected in step 108 is not a rising edge, pulse width is determined in step 112.

The calculated pulse width is compared to an allowable maximum pulse width in step 114. If the calculated pulse width is larger than the maximum pulse width permitted, the pulse width is set to the maximum in step 116. The pulse width, either that calculated or the maximum pulse width as previously determined, is averaged with the pulse widths of the previous seven (7) pulse widths in step 118. This results in a "smoothing" or filtering of the pulse width data. At the completion of step 118, pulse width data is output at step 106 and the software continues to look for another pulse edge.

It is useful to view this software algorithm as applied to the unfiltered squared pickup signal shown in FIG. 8. The software algorithm is interrupted on the occurrence every edge of the filtered squared pickup signal detected. Upon initialization in step 102, the software is set up to expect the first edge detected to be a rising edge. At the rising edge of long-duration high pulse 92, a pulse edge is detected in step 104. Because a rising edge is detected, the question of step 108 is answered on the affirmative. Therefore, the rising edge time is stored in step 110, the timer is set up to capture the falling edge time, the timer flag is cleared and the interrupt is exited.

At the point at which short-duration low pulse 94 falls, the software is again interrupted. This time, the edge captured is not a rising edge, so the pulse width is calculated in step 112 and the timer is set up to capture a rising edge the next time an edge is detected. The calculated pulse width is compared to the maximum pulse width, 1FF (hex) in this embodiment, in step 114 and if the calculated pulse width is greater than 1FF (hex), it is set to 1FF (hex) in step 116. At step 118, the calculated pulse width (or 1FF (hex)) is added to the previously stored seven (7) pulse widths and divided by eight (8). The newly calculated average is stored at step 106, the timer flag is cleared, and the interrupt is exited.

In one embodiment, one-half of the averaged pulse width (averaged pulse width/2) is actually stored in port B of microprocessor 38. This yields a 50% criteria for the high time, i.e., the high time of an input pulse must exceed 50% of the average high time of the previous eight (8) pulses. Shifting the value of one-half of the averaged pulse width one bit to the right and storing it to port C of microprocessor 38 yields a 25% criteria for the low time. These percentages are demonstrative. Other percentages may be used as deemed adequate for a particular application.

The embodiment of the software presented herein utilizes a single set of parameters (high and low time thresholds) for all pulses of the signal analyzed. Thus, no special set of parameters is set for an odd slot as utilized in the application of the adaptive digital filter in FIG. 1. It will be appreciated by those of skill in the art, however, that maintenance of an array of parameters is easily integrated into the software by means well known in the art. When implementing such an array, the software must also examine the pulse pattern to ascertain which expected valid pulse has been received by the filter. This function is one easily accomplished by one of skill in the art if the expected pattern of expected pulses is known. Also, it is conceivable that at least one protrusion on the rotatable disk may be sized differently than the other protrusions resulting in expected pulses of differing pulse widths. Again, an array of expected pulse widths may be handled by the software.

It will be appreciated by those of skill in the art that the adaptive functionality of the digital filter of the present invention in determining specified high and low time thresholds in real time may be accomplished by means other than software. For example, a ROM lookup table may be utilized in conjunction with a counter that counts the RPM of the rotating disk. The ROM lookup table would include high and low times of various disk RPMs. Upon determination of the RPM by the counter, the corresponding high and low times would be ascertained from the ROM table. Such a system would not, however, take into account variations in the sensor signal caused by the distance between the sensor and the disk, though it is conceivable that other inputs could be utilized to accommodate for such spacing.

Another hardware-oriented approach to determining high and low time thresholds in real time involves the use of a counter. When the signal goes high, the counter would accumulate the passage of time until the signal when low, thereby serving the same functionality as the counting algorithm employed in the software presented herein.

In the embodiment presented herein, microprocessor 38 utilizes eight (8) bit signals in communicating with first and second magnitude comparators 52 and 54. It will be appreciated that the use of eight (8) bits is not determinative. Rather, the number of bits employed is related to the desired resolution of the filter. More bits may be necessary or desired for valid signals of shorter duration than are illustrated herein. Similarly, it will be appreciated that changes in the clock synchronization of microprocessor 38 will effect the length of the pulse to be examined by the filter. Also, because acceleration and deceleration of rotatable mechanical systems are limited, it is necessary that the clock and microprocessor are capable of executing at sufficient speeds to detect the maximum changes in acceleration and deceleration.

In considering situations in which the adaptive digital filter of the present invention does not function as expected, it is worthy to note that it is conceivable, though not likely, that the filter could detect noise events upon initialization and interpret those noise events as valid signals. The adaptive digital filter of the present invention does assume that the initial data received is valid data. In application of the adaptive digital filter, this assumption is valid and therefore the undesirable situation of interpreting noise events as a valid pulse is minimized. For example, when employed in conjunction with an ignition system, the signal must be detected and synchronized before the engine starts. This means that initially noise events from the spark, the ignition coil, loosely mounted parts or vibrations caused by a moving vehicle do not generally exist. Should there be imperfections present on the rotatable disk, the "smoothing" algorithm employed in the microprocessor software helps to ensure that noise events caused by such imperfections are not interpreted as valid pulses.

It will be appreciated that the rotational speed of the disk in a timing system as described herein affects both the high time of a valid pulse and the low time between successive valid pulses. Thus, while the embodiment of the microprocessor of FIG. 9 uses the measured pulse width of a valid pulse to adjust the specified thresholds for the next expected valid pulse, the same result may be obtained by using the measured low time between successive valid pulses for adjusting the specified thresholds for the next expected valid pulse. To use measured low times, the counter of the microprocessor counts the passage of time between valid pulses detected. Because both high time and low time are predictably variable in relation to the speed of rotation of the disk, either measured pulse width or measured low time between valid pulses or both may be utilized by the filter of the present invention for adjusting the specified pulse width and duty cycle.

It will be further appreciated that the filter and method of filtering disclosed herein need not be limited to use with a system having a rotating element with discontinuities thereon. Rather, the filter and filtering method operate in conjunction with a repetitive or patterned pulse train, such as may be generated by an oscillating system, for example. The invention accommodates predictable changes in the pattern of the pulse train based on timing changes in the filtered signal.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

We claim:

1. A method for filtering noise pulses from a binary signal produced by an engine shaft rotation sensor, the binary signal having a series of pulses separated by a baseline signal level, such pulses having widths that vary with engine speed and with a distance between an engine shaft and said sensor, the method comprising the steps of:

(a) filtering the binary signal by eliminating: (1) pulses of shorter duration than a minimum pulse time interval and (2) pulses occurring during a minimum baseline time interval following each pulse which is not eliminated; and (b) periodically measuring the widths of selected pulses of the filtered binary signal, and using said measured widths to update said minimum pulse time interval and said minimum baseline time interval for filtering of a pulse following said selected pulses, thereby to compensate said minimum pulse time interval and said minimum baseline time interval for chances in engine speed and for conditions that change said distance between said engine shaft and said sensor.

2. The method of claim 1, wherein the updating of said minimum pulse time interval and said minimum baseline time interval includes forming a running average of successively measured pulse widths and updating said minimum pulse time interval and said minimum baseline time interval based on said running average.

3. The method of claim 1, wherein the updating of said minimum pulse time interval includes setting the minimum pulse time interval to a predetermined percentage of said measured widths.

* * * * *